United States Patent [19]

Nakano et al.

[11] Patent Number: 5,051,959

[45] Date of Patent: Sep. 24, 1991

[54] COMPLEMENTARY SEMICONDUCTOR MEMORY DEVICE INCLUDING CELL ACCESS TRANSISTOR AND WORD LINE DRIVING TRANSISTOR HAVING CHANNELS OF DIFFERENT CONDUCTIVITY TYPE

[75] Inventors: Tomio Nakano, Kawasaki; Yoshihiro Takemae, Tokyo, both of Japan

[73] Assignee: Fujitsu Limited, Kawasaki, Japan

[21] Appl. No.: 430,968

[22] Filed: Nov. 1, 1989

Related U.S. Application Data

[63] Continuation of Ser. No. 304,876, Feb. 1, 1989, abandoned, which is a continuation of Ser. No. 896,284, Aug. 17, 1986, abandoned.

[30] Foreign Application Priority Data

Aug. 14, 1985 [JP] Japan ............................ 60-178959

[51] Int. Cl.[5] ........................................ G11C 11/407
[52] U.S. Cl. .............................. 365/230.06; 365/149; 365/181; 307/449; 307/451
[58] Field of Search .............. 365/199, 181, 203, 204, 365/230.06, 449, 451, 463

[56] References Cited

U.S. PATENT DOCUMENTS

| 4,156,940 | 5/1979 | Hollingsworth et al. | 365/230.06 |
| 4,189,782 | 2/1980 | Dingwall | 365/190 |
| 4,628,486 | 12/1986 | Sakui | 365/149 |
| 4,697,252 | 9/1987 | Furuyama et al. | 365/149 |

FOREIGN PATENT DOCUMENTS 0061289 9/1982 European Pat. Off. .
0090632 10/1983 European Pat. Off. .
0169452 1/1986 European Pat. Off. .
2078405A 1/1982 United Kingdom .

OTHER PUBLICATIONS

Katsuhiro Shimohigashi et al., "An n-Well CMOS Dynamic RAM", 8107 IEEE Journal of Solid-State Circuits, vol. SC-17 (1982) Apr., No. 2, New York, pp. 344–348.

Roger G. Stewart, "High Density CMOS ROM Arrays," 1977 IEEE International Solid-State Circuits Conference, vol. 20, No. 20, Feb. 1977, pp. 20–21.

R. I. Kung et al., A Sub 100ns 265 K Dram in CMOS III Technology, pp. 278–279, Digest of Tech. Paper of ISSCC, Feb. '84.

Primary Examiner—Glenn Gossage
Attorney, Agent, or Firm—Staas & Halsey

[57] ABSTRACT

A complementary semiconductor memory device comprises a memory cell array (73, 100) in which each cell ($MC_p$; $MC_{po}$) has a first MIS transistor ($Q_p$); $Q_{p1}$, $Q_{p2}$) of a first conduction type connected to a word line, a decoding circuit (71) for decoding an input address signal and generating a selecting signal, and a driving circuit (72; 90) having a second MIS transistor ($W_{80}$) of a second conduction type opposite to the first conduction type for driving the word line, thereby improving the operation speed thereof, while decreasing the possibility of the destruction of information in each cell by α-rays. A word drive signal having a negative potential may be used, and the threshold voltage of the second MIS transistor is selected to be greater than an absolute valve of the threshold voltage of the first MIS transistor.

7 Claims, 7 Drawing Sheets

COMPLEMENTARY SEMICONDUCTOR MEMORY DEVICE INCLUDING CELL ACCESS TRANSISTOR AND WORD LINE DRIVING TRANSISTOR HAVING CHANNELS OF DIFFERENT CONDUCTIVITY TYPE

This is a continuation of co-pending application Ser. No. 07/304,896 filed on Feb. 1, 1989, now abandoned, which is a continuation of Ser. No. 06/896,284 filed on Aug. 14, 1986, now abandoned.

BACKGROUND OF THE INVENTION

1. Field of the Invention

The present invention relates to a complementary semiconductor memory device and, more particularly, to a complementary semiconductor memory device having a circuit for driving a word line connected to a MOS (metal oxide semiconductor) transistor, or more broadly, MIS (metal insulator semiconductor) transistor, used as an access gate in each of a plurality of memory cells.

2. Description of the Related Art

In a conventional semiconductor memory device, both a MOS transistor used as an access gate in a cell (hereinafter referred to as an access gate MOS transistor) and a MOS transistor for driving a word line connected to the access gate MOS transistor, (hereinafter referred to as a word line driver MOS transistor), are usually of the same conduction type.

In general, an N-channel type MOS transistor can operate at a high speed because it has a relatively high carrier mobility compared with a P-channel type MOS transistor, and a semiconductor memory cell or device using such an N-channel type MOS transistor can be miniaturized because of a high mutual conductance (gm). Therefore, in many cases, N-channel type MOS transistors are employed for both the access gate MOS transistor and the word line driver MOS transistor.

However, in the semiconductor memory device where memory cells using N-channel type MOS transistors are miniaturized with a higher degree of integration, there is a problem in that a soft error easily occurs due to the irradiation of $\alpha$-rays, which are radiated from radioactive substances of uranium (U), thorium (Th) or the like contained in a package or semiconductor materials, resulting in the destruction of a content of the memory cell. The above-mentioned problem will be explained later in more detail.

On the other hand, a memory cell using a P-channel MOS transistor has an advantage in that a soft error due to $\alpha$-rays does not occur so easily as in a memory cell using an N-channel MOS transistor. Therefore, in order to decrease the possibility of the destruction of the information stored in the memory cell, some semiconductor memory devices employ P-channel MOS transistors for the access gate MOS transistor.

However, the device using P-channel MOS transistors has a disadvantage in that it cannot operate at as high a speed as the device using N-channel MOS transistors, because the mutual conductance (gm) of a P-channel MOS transistor is lower than that of an N-channel MOS transistor. Assuming that the size of the P-channel MOS transistor used as the word line driver is increased to increase the driving ability, in other words, to improve the operation speed, another problem arises in that the device using P-channel MOS transistors cannot be miniaturized to the same extent.

SUMMARY OF THE INVENTION

It is an object of the present invention to provide a complementary semiconductor memory device having a relatively simple constitution, which enables a word line connected to a MOS transistor used as an access gate in each memory cell to be driven at a high speed, and the possibility of the destruction of the information stored in each memory cell to be greatly decreased.

The above-mentioned object is attained by providing a complementary semiconductor memory device comprising: a memory cell array, each cell having a first MIS transistor of a first conduction type for an access gate connected to each of a plurality of word lines; a decoding circuit for decoding an address signal input and, based on a result of the decoding, generating a selecting signal; and a driving circuit having a second MIS transistor of a second conduction type opposite to the first conduction type for selecting a specific word line among the plurality of word lines in response to the selecting signal.

The present invention will be described hereinafter in detail by way of examples with reference to the accompanying drawings.

DESCRIPTION OF THE PREFERRED EMBODIMENTS

For a better understanding of the preferred embodiments, the problems in the related art will now be explained with reference to FIGS. 1 to 6.

Figure 1:
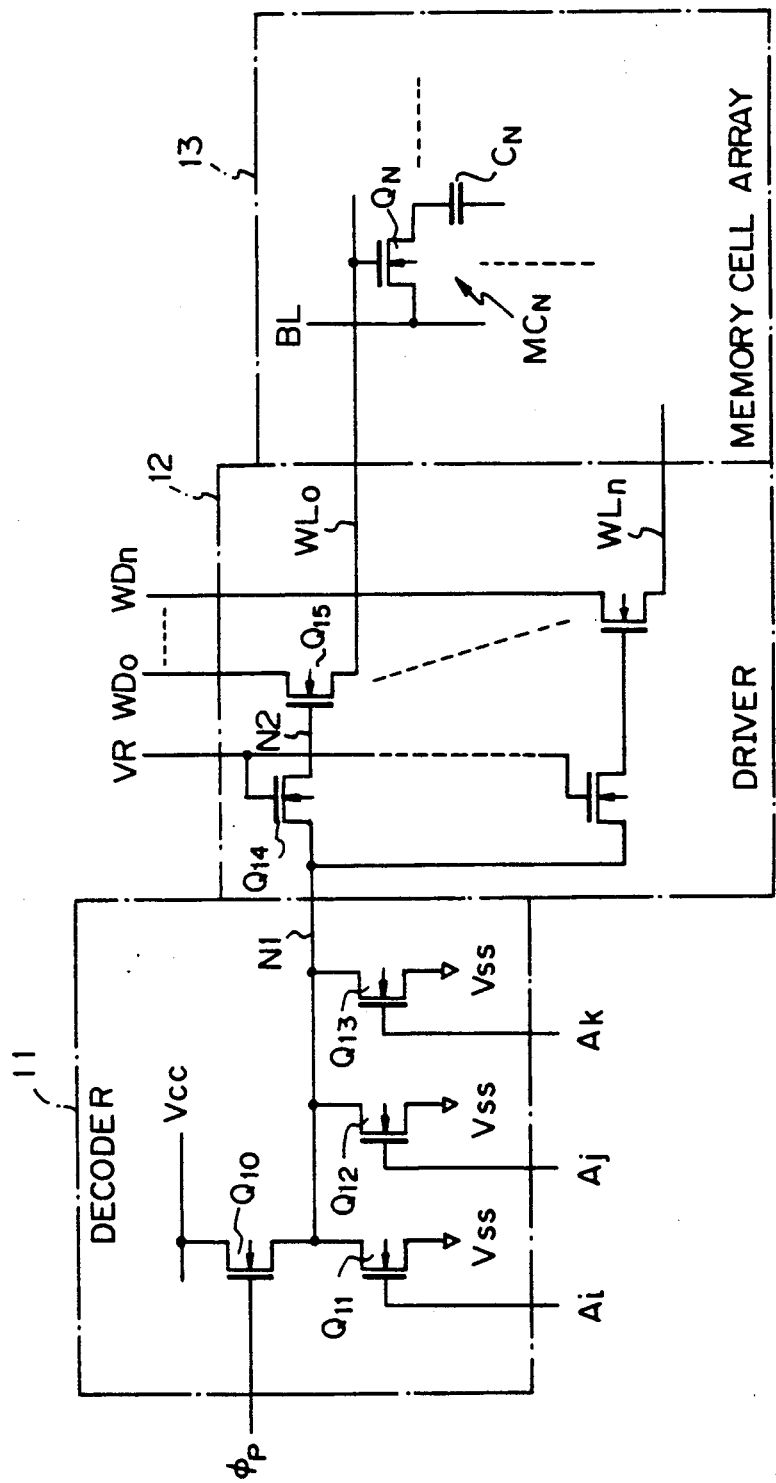
FIG. 1 is a circuit diagram illustrating a semiconductor memory device in which both an access gate MOS transistor and a word line driver MOS transistor are N-channel type.

FIG. 1 shows a DRAM (dynamic random access memory) device using N-channel MOS transistors. Referring to FIG. 1, reference numeral 11 denotes a decoder, which comprises a NOR gate consisting of four N-channel type MOS transistors $Q_{10}$, $Q_{11}$, $Q_{12}$, and $Q_{13}$. In the decoder 11, the MOS transistor $Q_{10}$ is connected between a higher voltage $V_{cc}$, for example, 5 V, and a node N1, and the gate thereof receives a clock signal $\phi_p$ for precharging a line of the node N1. The MOS transistors $Q_{11}$, $Q_{12}$, and $Q_{13}$ are, respectively, connected between the node N1 and a lower voltage $V_{ss}$, for example, 0 V, and the gates thereof receive an address signal having a plurality of bits (in the present example, three bits); namely the gates thereof receive address bits $A_i$, $A_j$, and $A_k$, respectively.

Reference numeral 12 denotes a driver, which comprises a predetermined number of N-channel MOS transistors, one of which is representatively denoted by a reference symbol $Q_{14}$, and the corresponding number of N-channel MOS transistors, one of which is representatively denoted by a reference symbol $Q_{15}$. In the driver 12, the sources of the MOS transistors $Q_{14}$ are commonly connected to the node N1, and the drains thereof are connected to the gates of the MOS transistors $Q_{15}$, respectively. To the gates of the MOS transistors $Q_{14}$, a predetermined reference voltage VR is applied. The drains of the MOS transistors $Q_{15}$ are connected to word lines $WL_o$ to $WL_n$, respectively, and the sources thereof receive clock signals $WD_o$ to $WD_n$, respectively, which are generated based on a predecoding of an address signal in a predecoder (not shown) and for selecting a specific word line among the group of word lines $WL_o$ to $WL_n$ selected by the NOR gate $Q_{10}$, $Q_{11}$, $Q_{12}$ and $Q_{13}$) The MOS transistor $Q_{15}$, in response to the signal applied to the gate thereof, i.e., the signal at a node N2, transmits the clock signal $WD_o$ to the word line $WL_o$, and drives the word line $WL_o$. At this time, the potential at the node N2 is boosted by the clock signal $WD_0$ to the potential exceeding the voltage $V_{cc}$, because the MOS transistor $Q_{14}$ is in a cut-off state. The MOS transistor $Q_{14}$ is hereinafter referred to as a cut gate MOS transistor.

Reference numeral 13 denotes a memory cell array consisting of a plurality of dynamic memory cells, one of which is representatively denoted by reference symbol $MC_n$. The dynamic memory cell MCn is constituted by an N-channel MOS transistor $Q_n$ for an access gate and a capacitor $C_n$ indicating the equivalent capacitance of the cell. The gate, source, and drain of the MOS transistor $Q_n$ are connected to the word line $WL_o$, the capacitor $C_n$, and a bit line BL for writing or reading data, respectively.

Figure 2:
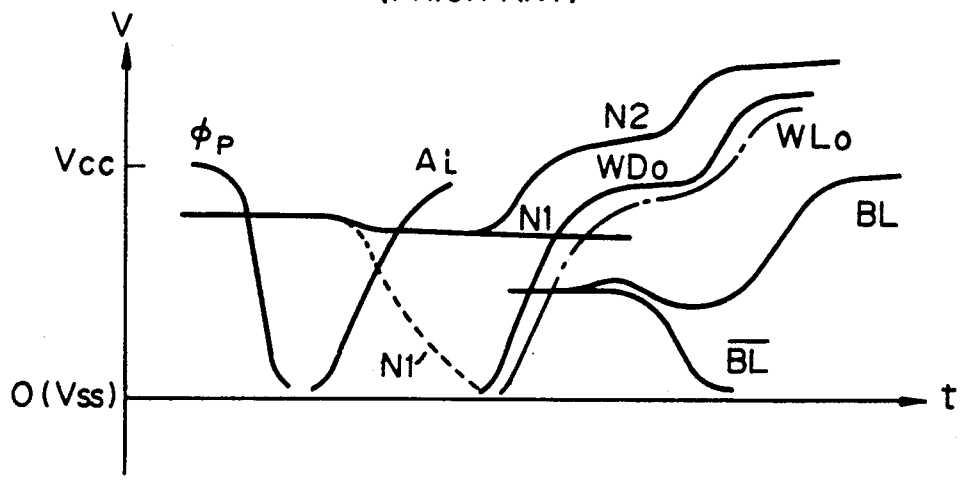
FIG. 2 is a waveform diagram illustrating the operation of the device shown in FIG. 1.

FIG. 2 illustrates waveforms for explaining the operation of the device shown in FIG. 1, where the word line $WL_o$ is selected. The operation of the device will be hereinafter described with reference to FIGS. 1 and 2.

First, the clock signal $\phi_p$ is at a higher level, i.e., the level of $V_{cc}$, and turns ON the MOS transistor $Q_{10}$, resulting in a charge-up state at the node N1. Then, the clock signal $\phi_p$ falls to 0V and turns OFF the transistor $Q_{10}$, and then, the address signal is input. If all of the address bits $A_i$, $A_j$, and $A_k$ are at the low level, all of the MOS transistors $Q_{11}$, $Q_{12}$, and $Q_{13}$ are in the OFF state, so that the potential at the node N1 is maintained at the high level. However, if any one of the address bits is at a high level, the corresponding transistor turns ON, so that the charges remaining at the node N1 are discharged through the ON state transistor and the potential at the node N1 falls to 0 V. This discharging state is shown by a broken line N1' in FIG. 2.

When the potential at the node N1 is maintained at the high level, as shown by a solid line in FIG. 2, the memory cell $MC_n$ is brought to a selecting state. The MOS transistor $Q_{14}$, which is in the OFF state with the gate thereof supplied with the appropriate reference voltage VR, exerts the "bootstrap" effect of the transistor $Q_{15}$ more effectively. When the clock signal $WD_o$ for activating the predecoded word line rises in level, the potential at the word line $WL_o$ increases according to the rise of the clock signal $WD_o$. At this time, the potential at the node N2 increases due to the bootstrap effect. As a result, the bootstrap effect operation is effective and the potential at the node N2 is boosted to the potential exceeding the voltage $V_{cc}$, so that the potential at the word line $WL_o$ is boosted to the potential exceeding the voltage $V_{cc}$ according to the rise of the clock signal $WD_o$.

When the potential at the word line $WL_o$ rises, the access gate MOS transistor $Q_n$ turns ON, resulting in the charging from or discharging to the bit line BL of the capacitor $C_n$. For example, assuming that the data "1" is stored in the capacitor $C_n$, that is to say, the capacitor $C_n$ is charged to the voltage $V_{cc}$, the potential at the bit line BL precharged to the voltage of $V_{cc}/2$ is raised by the charges of the capacitor $C_n$, resulting in the generation of the potential difference between the bit line BL and the other bit line $\overline{BL}$ (not shown). This potential difference is amplified by a sense amplifier (not shown), so that the potential of the low level side is quickly pulled down to the lower voltage $V_{ss}$, i.e., 0 V, and the potential of the high level side is quickly pulled up to the higher voltage $V_{cc}$, i.e., 5 V.

The device constituted as shown in FIG. 1 is widely used since it employs the N-channel MOS transistor $Q_{15}$, whose mutual conductance gm and driving ability are great, as a word line driver MOS transistor, and accordingly, it can realize a high speed operation by causing the change of the potential at the word line $WL_o$ to quickly follow the change of the clock signal $WD_o$. However, the device shown in FIG. 1 offers a problem. For example, assuming that high level data is written into the capacitor $C_n$, the potential at the word line $WL_o$ must be boosted to the potential exceeding the voltage of $V_{cc}$ plus $V_{th}$, where $V_{th}$ is a threshold voltage of the transistor $Q_n$. In this case, the potential at the node N2 rises to the voltage of 2 $V_{cc}$ to 2.5 $V_{cc}$ due to the bootstrap effect, with the result that the problems of a break-down voltage in the P-N junction of the transistor $Q_{14}$, a bad influence by hot electrons occurring in the P-N junction, a fall in the reliability or the like. Also, the device shown in FIG. 1 causes another problem, which will be hereinafter described.

Figure 3:
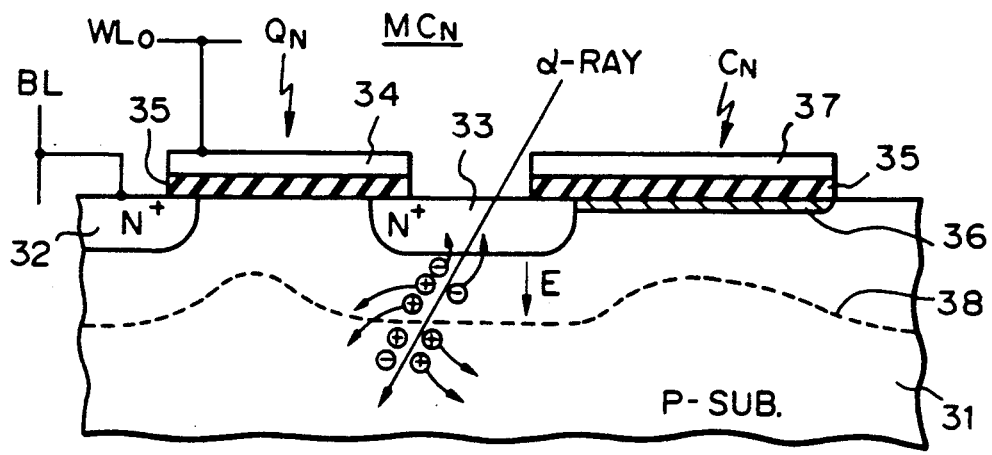
FIG. 3 is a sectional view of the cell shown in FIG. 1, for explaining the influences on the cell from the impingement of $\alpha$-rays.

FIG. 3 is a sectional view of the memory cell $MC_n$ shown in FIG. 1, for explaining the influences on the memory cell from the impingement of α-rays. Referring to FIG. 3, reference numeral 31 denotes a P-type semiconductor substrate, on which N+ type regions constituting a drain 32 and a source 33 of the transistor $Q_n$ are formed. Reference numeral 34 denotes a gate formed above the channel between the N+ type regions via an insulation layer 35 made of silicon oxide film. The drain 32 is connected to the bit line BL, and the gate 34 is connected to the word line $WL_o$. Reference numeral 36 denotes an N-type inversion layer formed on the substrate 31, which constitutes a MOS type capacitor $C_n$. Reference numeral 37 denotes an electrode used for forming the N-type inversion layer 36, which is formed above the substrate 31 via the insulation layer 35. Reference numeral 38 denotes a depletion layer extending from the surface of the substrate to the depth within the substrate.

In the dynamic memory cell $MC_n$ shown in FIG. 3, when α-rays impinge on the substrate 31, a plurality of pairs of an election $\ominus$ and a hole $\oplus$ are produced. Since the electric field E is directed to the direction shown by an arrow mark within the depletion layer 38, electrons ⊖ among the pairs of an electron and a hole are accelerated by the field E and enter into the source region 33. The electrons ⊖ have a high mobility, and accordingly, even if the electrons are those produced in the bottom part of the substrate 31, they are first bound for the depletion layer 38 by diffusion, then accelerated by the field E, and enter the source region 33. The entry of the electrons into the source region causes the potential of the source region to change, resulting in a change in the amount of charges in the capacitor $C_n$. For example, even if the information "1" is written into the capacitor $C_n$ by charging the N+ type region 33 to 5 V, the potential in the N+ type region 33 is lowered to 2 V or 1 V by the injection of electrons ⊖, so that the above case becomes equivalent to that wherein the information "0" is written into the capacitor $C_n$. This means that the information stored in the memory cell may be or is inverted.

Figure 4:
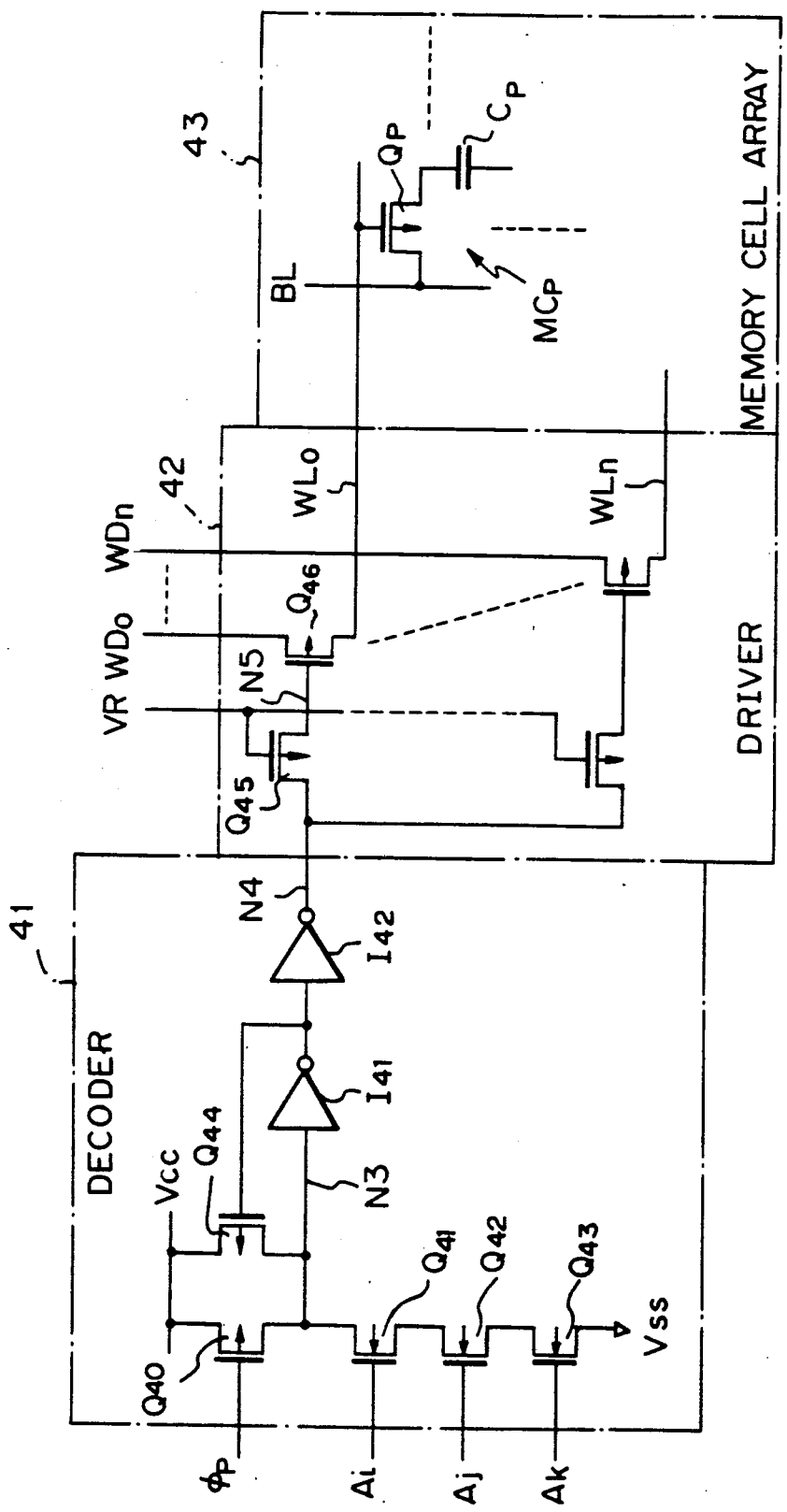
FIG. 4 is a circuit diagram illustrating a semiconductor memory device in which both an access gate MOS transistor and a word line driver MOS transistor are P-channel type.

FIG. 4 shows another DRAM device, where both an access gate MOS transistor and a word line driver MOS transistor are P-channel type. Referring to FIG. 4, reference numeral 41 denotes a decoder, which comprises a NAND gate consisting of a P-channel type MOS transistor $Q_{40}$ and three N-channel MOS transistors $Q_{41}$, $Q_{42}$, and $Q_{43}$, a P-channel type MOS transistor $Q_{44}$, and two inverters $I_{41}$ and $I_{42}$. In the decoder 41, the MOS transistor $Q_{40}$ is connected between a higher voltage $V_{cc}$, for example, 5 V, and a node N3, and the gate thereof receives a clock signal $\phi_p$ for precharging a line of the node N3. The MOS transistors $Q_{41}$, $Q_{42}$, and $Q_{43}$ are connected in series between the node N3 and a lower voltage $V_{ss}$, for example, 0 V, and the gates thereof receive an address signal having a plurality of bits (in the present example, three bits), that is, the gates thereof receive address bits $A_i$, $A_j$ and $A_k$, respectively. The MOS transistor $Q_{44}$ is connected between the higher voltage $V_{cc}$ and the node N3, and the gate thereof is connected to a junction between the inverters $I_{41}$ and $I_{42}$ which are connected in series between the node N3 and a node N4. The MOS transistor $Q_{44}$ functions to keep the voltage level at the node N3 at the high level of $V_{cc}$ even if the MOS transistor $Q_{40}$ is turned OFF by the clock signal $\phi_p$ of a high level.

Reference numeral 42 denotes a driver, which has the same constitution as the driver 12 shown in FIG. 1, but employs P-channel MOS transistors $Q_{45}$ and $Q_{46}$ in place of the N-channel MOS transistors $Q_{14}$ and $Q_{15}$. Similarly, reference numeral 43 denotes a memory cell array which has the same constitution as the memory cell array 13 shown in FIG. 1, but employs dynamic memory cells $MC_p$ consisting of a P-channel MOS transistor $Q_p$ and a capacitor $C_p$ in place of the N-channel MOS transistor $Q_n$ and the capacitor $C_n$.

Figure 5:
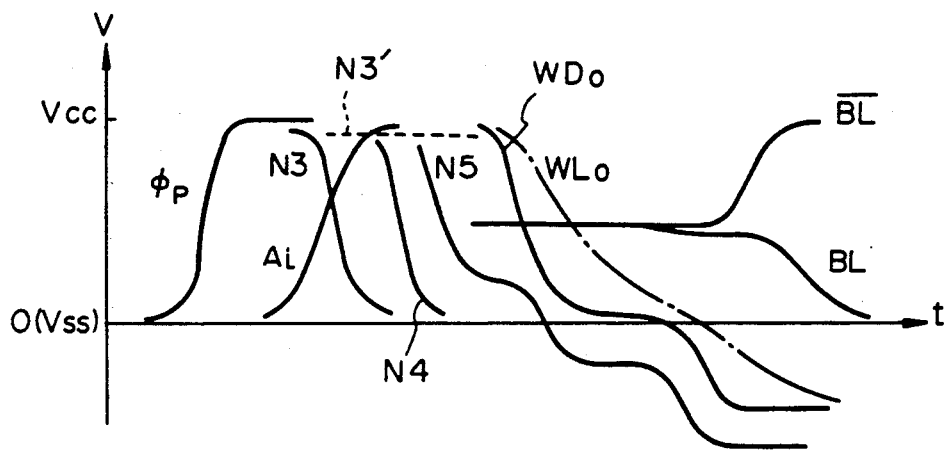
FIG. 5 is a waveform diagram illustrating the operation of the device shown in FIG. 4.

FIG. 5 illustrates waveforms for explaining the operation of the device shown in FIG. 4, where the word line $WL_o$ is selected. The operation of the device will be hereinafter described with reference to FIGS. 4 and 5.

First, the clock signal $\phi_p$ is at a lower level, i.e., 0 V, and turns ON the MOS transistor $Q_{40}$, resulting in a charge-up state at the node N3. This charge-up state is maintained by the ON state of the MOS transistor $Q_{44}$ because the gate thereof receives a low level voltage via the inverter $I_{41}$. Then the clock signal $\phi_p$ rises to a higher level, i.e., $V_{cc}$, and turns OFF the MOS transistor $Q_{40}$, and then, the address signal is input. If all of the address bits $A_i$, $A_j$, and $A_k$ are at the high level, all of the MOS transistors $Q_{41}$, $Q_{42}$ and $Q_{43}$ turn ON and the charges remaining at the node N3 are discharged through these transistors, so that the potential at the node N3 falls to 0 V, i.e., $V_{ss}$. However, if any one of these bits is at the low level, the corresponding transistor turns OFF, so that the potential at the node N3 is maintained at a high level. The waveform in this case is shown by a broken line N3' in FIG. 5.

When the potential at the node N3 is brought to the low level, the memory cell $MC_p$ is brought to a selecting state. At this time, the potential at the node N4 also falls to the lower voltage via the inverters $I_{41}$ and $I_{42}$, and furthermore, the potential at the node N5 begins to fall via the ON transistor $Q_{45}$. However, since the transistor $Q_{45}$ is P-channel, the change in the potential at the node N5 is slow, so that the potential at the node N5 does not completely fall to 0 V. For example, assuming that the threshold voltage of the P-channel MOS transistor $Q_{45}$ is 1 V, the potential at the node N5 falls to about 1 V and stays there.

When the potential at the node N5 falls to a level at which the word line driver MOS transistor $Q_{46}$ turns ON, the clock signal $WD_o$ is applied to the source of the transistor $Q_{46}$, so that the potential of the word line $WL_o$ follows the change in the level of the clock signal $WD_o$. As is shown in FIG. 5, the word line $WL_o$ is boosted to the negative voltage, resulting in a complete ON state of the MOS transistor $Q_p$ in the memory cell. At this time, the potential at the node N5 is boosted by the clock signal $WD_0$ to the negative voltage, because the MOS transistor $Q_{45}$ is in a cut-off state.

In the device constituted as shown in FIG. 4, however, a problem arises as explained below. Since the cut gate MOS transistor $Q_{45}$ and the word line driver MOS transistor $Q_{46}$ are P-channel type having a relatively small mutual conductance gm, the operation speed is relatively low. Also, since the output of the decoder 41 appearing at the node N3 is transmitted to the driver 42 via two inverters $I_{41}$ and $I_{42}$, the operation speed becomes even more low. Assuming that the size of the P-channel MOS transistor $Q_{46}$ is increased to increase the driving ability, that is, to improve the operation speed, the time of the transmission of the clock signal $WD_o$ to the word line $WL_o$ is reduced. On the other hand, the load at the node N5 increases, so that the time of the transmission of the potential at the node N5 to the node N4 is extended. To prevent this, the size of the MOS transistor $Q_{45}$ must be increased, and this can not lead to a fundamental improvement of the operation speed.

Figure 6:
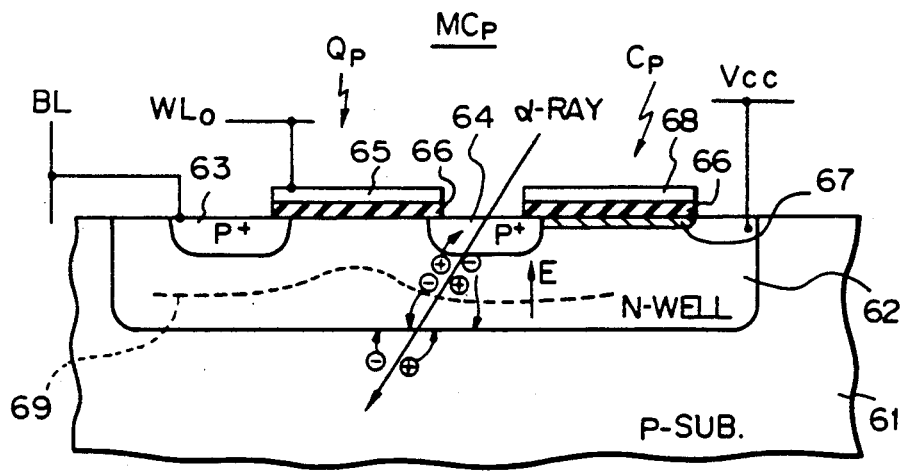
FIG. 6 is a sectional view of the cell shown in FIG. 4, for explaining the influences on the cell by the irradiation $\alpha$-rays.

FIG. 6 is a sectional view of the memory cell $MC_p$ shown in FIG. 4, for explaining the influences on the memory cell from the impingement of α-rays. Referring to FIG. 6, reference numeral 61 denotes a P-type semiconductor substrate, on which an N-type region constituting a well 62 is formed. On the N-type well 62, P+-type regions constituting a drain 63 and a source 64 of the transistor $Q_p$ are formed. Reference numerals 65, 66, 67, 68 and 69 are a gate, an insulation layer, a P-type inversion layer, an electrode and a depletion layer, respectively. The relation of connection between the constituent elements in FIG. 6 is the same as that in FIG. 3, except that a P-channel MOS transistor is employed in place of a N-channel MOS transistor as a transistor constituting the memory cell.

In the dynamic memory cell $MC_p$ shown in FIG. 6, holes ⊕ among the pairs of an electron and a hole produced due to the impingement of α-rays on the substrate 61 enter the source region 64, resulting in a change in the amount of charges in the capacitor $C_p$. This change leads to the possibility of the destruction of the information in the cell.

However, the possibility of the destruction of the information in the memory cell using P-channel MOS transistors is less than that in the memory cell using N-channel MOS transistors, because in the N-type memory cell as shown in FIG. 3, electrons $\ominus$ easily enter the source region 33 due to their high mobility, while in the P-type memory cell as shown in FIG. 6, few holes $\oplus$ enter the source region 64 due to their low mobility. Therefore, considering the possibilities of the occurrence of soft errors due to the impingement of α-rays, the device using P-channel type cell is more preferable than the device using N-channel type cell.

A preferred embodiment of the present invention will be described hereinafter in detail with reference to FIGS. 7 and 8.

Figure 7:
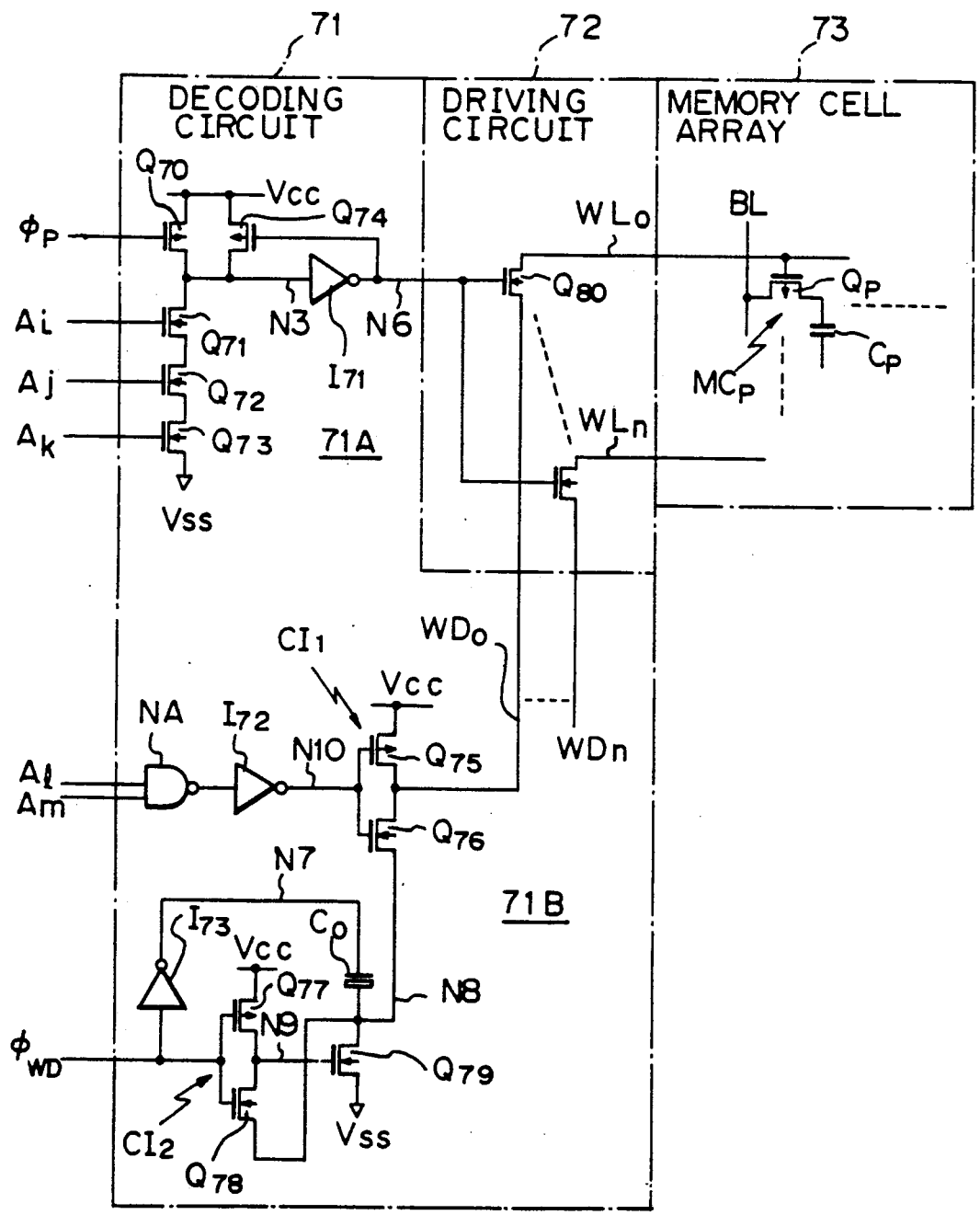
FIG. 7 is a circuit diagram illustrating a complementary semiconductor memory device as an embodiment of the present invention.

In FIG. 7, which illustrates a circuit diagram of a complementary semiconductor memory device as an embodiment of the present invention, reference numeral 71 denotes a decoding circuit comprising a decoder 71A and a predecoder 71B.

In the decoder 71A, a MOS transistor $Q_{70}$ is connected between a higher voltage $V_{cc}$, for example, 5 V, and a node N3, and the gate thereof receives a clock signal $\phi_p$ for precharging a line of the node N3. MOS transistors $Q_{71}$, $Q_{72}$, and $Q_{73}$ are connected in series between the node N3 and a lower voltage $V_{ss}$, for example, 0 V, and the gates thereof receive predetermined address bits $A_i$, $A_j$, and $A_k$ respectively, which are part of a plurality of bits constituting an address signal. That is, MOS transistors $Q_{70}$, $Q_{71}$, $Q_{72}$, and $Q_{73}$ constitute a NAND gate. A MOS transistor $Q_{74}$ is connected between the higher voltage $V_{cc}$ and the node N3, and the gate thereof is connected to the output of an inverter $I_{71}$ whose input is connected to the node N3. The MOS transistor $Q_{74}$ functions to keep the potential at the node N3 at the high level even if the MOS transistor $Q_{70}$ is turned OFF by the clock signal $\phi_p$ of a high level. The output point of the inverter $I_{71}$ is hereinafter referred to as a node N6.

On the other hand, in the predecoder 71B, reference symbol NA denotes a NAND gate, to which the address bits Al and Am, which are the rest of the aforementioned address bits, are input. The output of the NAND gate NA is connected via an inverter $I_{72}$ to a CMOS inverter circuit $CI_1$. The source of the MOS transistor $Q_{75}$ in the CMOS Inverter circuit $CI_1$ is connected to the higher voltage, i.e., $V_{cc}$. The input point of the CMOS inverter circuit $CI_1$ is hereinafter referred to as a node N10. Reference symbol $CI_2$ denotes another CMOS inverter circuit consisting of a P-channel MOS transistor $Q_{77}$ and an N-channel MOS transistor $Q_{78}$. To the respective gate of the CMOS inverter circuit $CI_2$, a $\phi_{WD}$ clock signal for controlling the timing of the generation of a clock signal $WD_o$ to be generated based on a predecoding of address bits Al and Am is input. This clock $\phi_{WD}$ is also input to an inverter $I_{73}$. The source of the MOS transistor $Q_{77}$ is connected to the higher voltage, i.e., $V_{cc}$, and the source of the MOS transistor $Q_{78}$ is connected to the drain of an N-channel type MOS transistor $Q_{79}$. The source of this MOS transistor $Q_{79}$ is connected to the lower voltage i.e., $V_{ss}$, and the gate thereof is connected to the output of the CMOS inverter circuit $CI_2$, that is, the respective drain of the MOS transistors $Q_{77}$ and $Q_{78}$. The output point of the CMOS inverter circuit $CI_2$ is hereinafter referred to as a node N9. The output of the inverter $I_{73}$ is connected via a capacitor $C_o$ to the drain of the MOS transistor $Q_{79}$. The output point of the inverter $I_{73}$ is hereinafter referred to as a node N7. The drain of the MOS transistor $Q_{79}$ is connected to the source of the MOS transistor $Q_{76}$ constituting the CMOS inverter circuit $CI_1$. The output point of this MOS transistor $Q_{79}$ is hereinafter referred to as a node N8.

Reference numeral 72 denotes a driving circuit, which comprises a predetermined number of N-channel type MOS transistors, one of which is representatively denoted by reference symbol $Q_{80}$. The gates of the MOS transistors $Q_{80}$ are commonly connected to the node N6, and the drains thereof are connected to word lines $WL_o$ to $WL_n$, respectively. Also, the sources thereof receive clock signals $WD_o$ to $WD_n$, respectively, which are generated by the predecoder 71B and are for selecting a specific word line among the group of word lines $WL_o$ to $WL_n$ selected by the NAND gate ($Q_{70}$, $Q_{71}$, $Q_{72}$ and $Q_{73}$). The MOS transistor $Q_{80}$, in response to the signal applied to the gate thereof, transmits the clock signal $WD_o$ to the word line $WL_o$, and drives the word line $WL_o$.

Reference numeral 73 denotes a memory cell array consisting of a plurality of dynamic type memory cells, one of which is representatively denoted by reference symbol $MC_p$. The memory cell $MC_p$ is constituted by a P-channel MOS transistor $Q_p$ for an access gate and a capacitor $C_p$ indicating the equivalent capacitance of the cell. The gate, source, and drain of the transistor $Q_p$ are connected to the word line $WL_o$, the capacitor $C_p$, and a bit line BL for writing or reading data, respectively.

Figure 8:
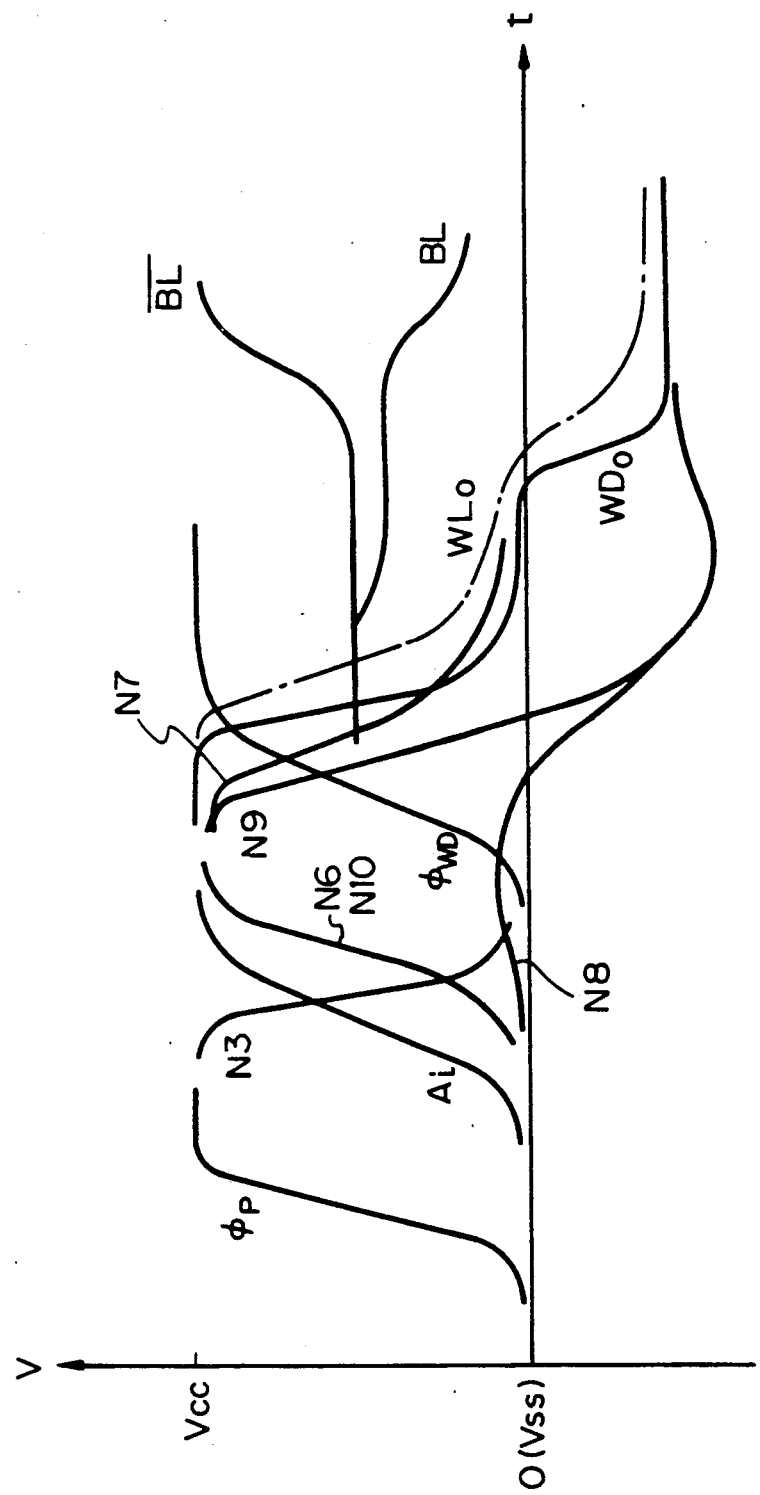
FIG. 8 is a waveform diagram illustrating the operation of the device shown in FIG. 7.

FIG. 8 illustrates waveforms for explaining the operation of the device shown in FIG. 7, where the word line $WL_o$ is selected. The operation of the device will be hereinafter described with reference to FIGS. 7 and 8.

First, the clock signal $\phi_p$ is at a lower level, i.e., 0 V, and turns ON the MOS transistor $Q_{70}$, resulting in a charge-up state at the node N3. This charge-up state at the node N3 is maintained by the ON state of the MOS transistor $Q_{74}$ because the gate thereof receives a low level voltage via the inverter $I_{71}$. At this time, the potential at the node N10 is at a lower level, i.e., 0 V, so that the MOS transistor $Q_{75}$ is in the ON state, resulting in a high level state of the clock signal $WD_o$. Since the potential at the node N6 is at the low level, the N-channel type MOS transistor $Q_{80}$ is maintained in the OFF state, resulting in a non-selection state of the word line $WL_o$.

Then, the clock signal $\phi_p$ rises to a higher level, i.e., $V_{cc}$, and turns OFF the MOS transistor $Q_{70}$, and then, the address signal is input. If all of the address bits $A_i$, $A_j$, and $A_k$ are at the high level, all of the MOS transistors $Q_{71}$, $Q_{72}$, and $Q_{73}$ turn ON and the charges remaining at the node N3 are discharged through these transistors, so that the potential at the node N3 falls to 0 V, and the potential at the node N6 rises to a higher level. In this case, the potential at the node N6 quickly rises to the higher level because the word line driver MOS transistor $Q_{80}$ is an N-channel and can be constituted in the smaller size than the word line driver MOS transistor $Q_{46}$ of P-channel shown in FIG. 4.

On the other hand, when the level of the clock signal $\phi_{WD}$ rises to the higher level at a predetermined timing, the potential at the node N9 begins to change from the higher level to the lower level and the potential at the node N7 also falls to the lower level. At this time, the potential at the node N8 is lowered to the negative potential by the operation of the capacitor $C_o$, and the potential at the node N9 is clamped to the negative potential due to the ON state of the MOS transistor $Q_{78}$. That is, the potential at the node N8 is boosted to the negative voltage, and this state is maintained because the MOS transistor $Q_{79}$ never turns ON, due to the equality of levels at the nodes N9 and N8. This negative voltage at the node N8 is applied to the source of the N-channel type MOS transistor $Q_{76}$. On the other hand, when high level signals are input to the NAND gate NA as address bits Al and Am, the potential at the node N10 rises to the higher level, resulting in the ON state of the MOS transistor $Q_{76}$. Therefore, the potential of the clock signal $WD_o$ begins to fall from the higher level $V_{cc}$ to the negative potential, and then stays at the negative potential. This clock signal $WD_o$ of the negative potential is applied to the source of the word line driver MOS transistor $Q_{80}$.

Since the potential at the node N6 is now at the higher level, the MOS transistor $Q_{80}$ turns ON, so that the potential at the word line $WL_o$ quickly falls according to the change in the clock signal $WD_o$. Then, the potential at the word line $WL_o$ stays at the same negative potential as the clock signal $WD_o$, resulting in a selection state of the memory cell $MC_p$.

When the potential at the word line $WL_o$ is at the negative level, the access gate MOS transistor $Q_p$ turns ON, resulting in a charging from or discharging to the bit line BL of the capacitor $C_p$. After this, the operation in the memory cell is made similarly with the case of the N-channel type cell.

According to the constitution of the device shown in FIG. 7, the operation of transmitting a signal between the word line $WL_o$ and the line of the clock signal $WD_o$ can be quickly made because the N-channel MOS transistor $Q_{80}$ is employed as a word line driver. Also, the MOS transistor $Q_{80}$ is sufficiently maintained in the ON state since the source thereof receives the clock signal $WD_o$ having a negative voltage when the gate thereof receives a higher level voltage. Therefore, the device shown in FIG. 7 does not need a cut gate MOS transistor for causing a bootstrap effect, for example, as shown in FIG. 1 as the reference symbol $Q_{14}$. This means that the device shown in FIG. 7 can realize a simpler constitution of circuits. Since the P-channel MOS transistor $Q_p$ is employed as an access gate in the memory cell, the possibilities of the occurrence of soft errors due to the impingement of α-rays on the memory cell are decreased compared with the case of the device using N-channel MOS transistors.

Additionally, in order to ensure the reliable operation of the device shown in FIG. 7, the following points should be fully considered.

The potential at the node N6 of the non-selected decoder is at the low level when the signal $\phi_{WD}$ is applied. Accordingly, the MOS transistor $Q_{80}$ should be in the OFF state. However, when the level of the clock signal $WD_o$ falls to a level below the ground level in the non-selection state, the MOS transistor $Q_{80}$ turns ON, resulting in a fall of the potential at the word line $WL_n$. Accordingly, access gate MOS transistors connected to the word line $WL_n$ turn ON, resulting in the multi-selection state. One method for avoiding this state is to set the absolute value of the threshold voltage of the MOS transistor $Q_{80}$ to be greater than that of the MOS transistor $Q_p$, and to select the value of a negative potential of the clock signal $WD_o$ so that the transistor $Q_p$ can turn ON, but the transistor $Q_{80}$ cannot turn ON. Another method is to set the lower potential at the node N6 to be negative by the inverter $I_{71}$ so that the transistor $Q_{80}$ cannot turn ON even if the level of the clock signal $WD_o$ falls to a level below the ground level in the non-selection state. The former method is preferable because the constitution of circuits is simple.

Figure 9:
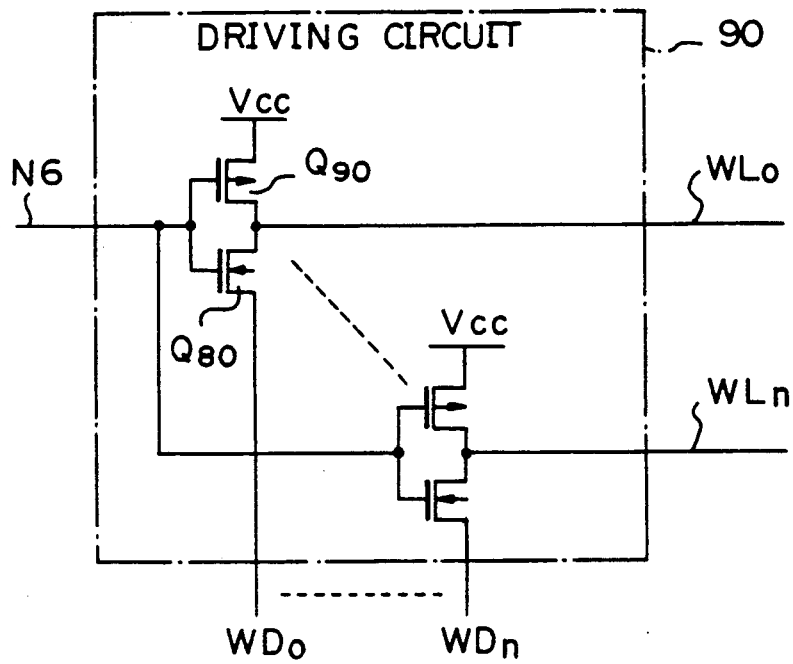
FIG. 9 is a circuit diagram illustrating part of a modification of the device shown in FIG. 7.

FIG. 9 illustrates a modification of the driving circuit shown in FIG. 7. Referring to FIG. 9, the driving circuit 90 comprises a predetermined number of N-channel MOS transistors, one of which is representatively denoted by reference symbol $Q_{80}$, and the corresponding number of P-channel MOS transistors, one of which is representatively denoted by reference symbol $Q_{90}$. A pair of MOS transistors $Q_{80}$ and $Q_{90}$ constitute a CMOS inverter circuit, whose input and output are connected to the node N6 and the word line $WL_o$, respectively. Also, the source of the MOS transistor $Q_{90}$ is connected to the higher voltage $V_{cc}$, and the source of the MOS transistor $Q_{80}$ receives the clock signal $WD_o$.

Referring to FIGS. 7 and 9, when the memory cell is not selected, the potential at the word line $WL_n$ should be at the high level. However, when the level of the clock signal $WD_n$ falls to a level below the ground, the MOS transistor $Q_{80}$ turns ON, resulting in a fall of the potential at the word line $WL_n$. To avoid this, the P-channel MOS transistor $Q_{90}$ is provided. That is, when decoder is not selected, the potential at the node N6 is at the lower level, so that the MOS transistor $Q_{90}$ turns ON and keeps the potential at the word line $WL_n$ at the high level of $V_{cc}$.

Figure 10:
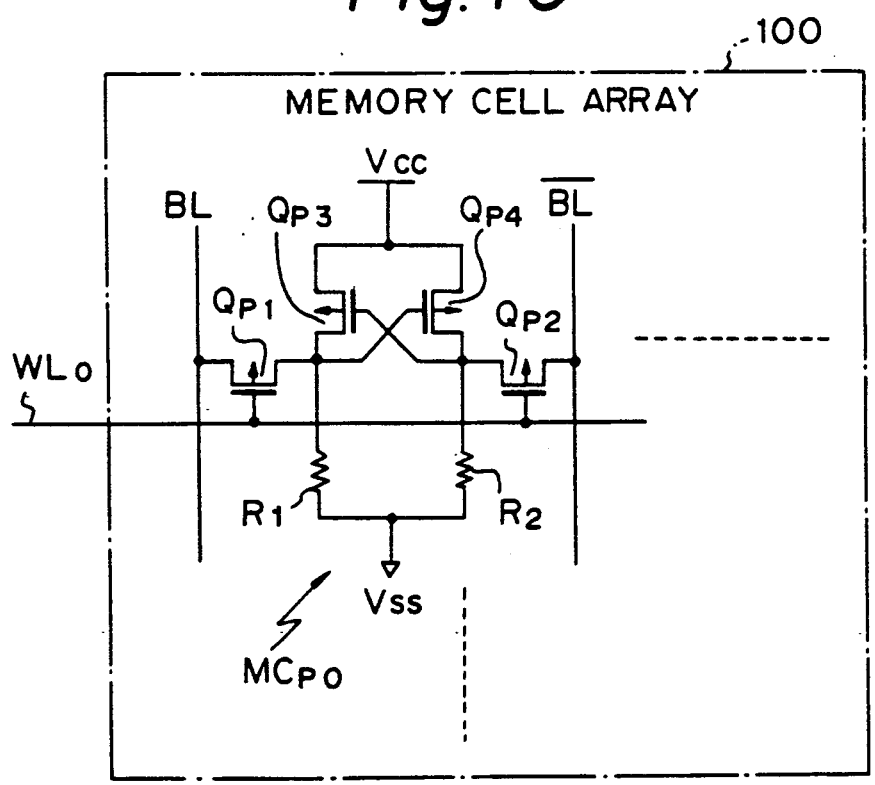
FIG. 10 is a circuit diagram illustrating part of another modification of the device shown in FIG. 7.

FIG. 10 illustrates a modification of the memory cell array shown in FIG. 7. Referring to FIG. 10, the memory cell array 100 comprises a plurality of static type memory cells, one of which is representatively denoted by reference symbol $MC_{po}$. The memory cell $MC_{po}$ is constituted by four P-channel MOS transistors $Q_{p1}$, $Q_{p2}$, $Q_{p3}$, and $Q_{p4}$, and two resistances $R_1$ and $R_2$. The MOS transistors $Q_{p3}$ and $Q_{p4}$ and the resistances $R_1$ and $R_2$ are connected so that they constitute a flip-flop circuit. Each of the MOS transistors $Q_{p1}$ and $Q_{p2}$ operates as a transfer gate, that is, each transistor transmits information between the flip-flop circuit and the bit line BL or $\overline{BL}$ in response to the voltage level at the word line $WL_o$.

The present invention may be practiced or embodied in still other ways without departing from the spirit or essential character thereof. For example, although in the illustrated preferred embodiments, a P-channel MOS transistor is used as an access gate of the one transistor cell and an N-channel MOS transistor is used as a word line driver, the conduction type of the MOS transistor used may be changed to the opposite conduction type.

We claim:

1. A complementary semiconductor memory device comprising:
   a plurality of word lines;
   a memory cell array including a plurality of memory cells, each memory cell connected respectively to one of said plurality of word lines and having a first MIS transistor of a P-channel type operating as an access gate;
   a decoding circuit for receiving and decoding an address signal input, and accordingly, generating a selecting signal;
   a driving circuit having a second MIS transistor of an N-channel type operating as a word line driver, said second MIS transistor having a source for receiving a word drive signal which is pulled down to a negative potential below that of a circuit ground potential under a predetermined condition, having a gate connected to said decoding circuit for receiving the selecting signal, and having a drain connected to a specified one of said word lines which is connected to a gate of an associated first MIS transistor, a threshold voltage of said second MIS transistor being selected to be greater than an absolute value of a threshold voltage of said associated first MIS transistor, and selected such that said second MIS transistor can substantially cut off the word drive signal pulled down to the negative potential from being transmitted to said specified one of said word lines when the selecting signal applied to the gate of said second MIS transistor is a logically low level indicating non-selection, whereby said word drive signal pulled down to the negative potential is transmitted to said specified one of said word lines only in a selection state.

2. A device according to claim 1, wherein each memory cell in said memory cell array s a dynamic type RAM cell.

3. A device according to claim 1, wherein each memory cell in said memory cell array is a static type RAM cell.

4. A device according to claim 1, wherein said decoding circuit comprises a decoder and a predecoder, said decoder generating the selecting signal for selecting a group of word lines including said specified one of said word lines in response to a first plurality of bits of the address signal, said predecoder generating the word drive signal for activating said specified one of said word lines at a specified timing.

5. A device according to claim 1, wherein said driving circuit further comprises a third MIS transistor having a P-channel connected between said specified one of said word lines to be driven and a power supply line having a logically high voltage, a gate of said third MIS transistor being connected to a gate of said second MIS transistor.

6. A device according to claim 5, wherein each memory cell in said memory cell array is a dynamic type RAM cell.

7. A device according to claim 5, wherein each memory cell in said memory cell array is a static type RAM cell.

* * * * *

UNITED STATES PATENT AND TRADEMARK OFFICE
CERTIFICATE OF CORRECTION

PATENT NO. : 5,051,959

DATED : SEPTEMBER 24, 1991

INVENTOR(S) : TOMIO NAKANO ET AL.

It is certified that error appears in the above-identified patent and that said Letters Patent is hereby corrected as shown below:

TITLE PAGE [63], line 1, "304,876" should be --304,896--;
line 3, "Aug. 17, 1986," should be
--Aug. 14, 1986,--;

[56] References Cited line 2, after "Dingwall .... 365/190"
insert the following:

--4,455,629   6/1984   Suzuki et al...... 365/230
 4,618,784  10/1986   Chappell et al.... 365/230
 4,623,989  11/1986   Blake ............ 365/230--;

FOREIGN PATENT DOCUMENTS line 1, after "0061289 .... Off. .",
insert --0061996  4/1985  Japan.--;

TITLE PAGE, Col. 2, line 1, after "0169452 ... Off. .",
insert --0212892  10/1985 Japan.--;

OTHER PUBLICATIONS line 8, "265" should be --256--;

line 10, after "Feb. '84.", insert

--Chwang et al., "A 70ns High Density CMOS DRAM", IEEE ISSCC Digest of Tech. Papers, Feb. 23, 1983, pp. 56-57, 285-286--;

UNITED STATES PATENT AND TRADEMARK OFFICE
CERTIFICATE OF CORRECTION

PATENT NO. : 5,051,959
DATED : SEPTEMBER 24, 1991
INVENTOR(S) : TOMIO NAKANO ET AL.

It is certified that error appears in the above-identified patent and that said Letters Patent is hereby corrected as shown below:

TITLE PAGE, Col. 2, [57] ABSTRACT line 3, "($Q_p$);" should be --($Q_p$;--;
line 7, "($W_{80}$)" should be --($Q_{80}$)--;
line 16, "valve" should be --value--.

Col. 1, line 52, "o-rays" should be --$\alpha$-rays--.

Col. 3, line 24, "$Q_{10}$," should be --($Q_{10}$,--;
line 25, "$Q_{13}$) The" should be --$Q_{13}$). The--.

Col. 10, line 44, "BL" should be --$\overline{BL}$--.

Col. 11, line 24, "s" should be --is--.

Signed and Sealed this

Eighteenth Day of May, 1993

Attest:

MICHAEL K. KIRK

*Attesting Officer*   Acting Commissioner of Patents and Trademarks